United States Patent [19]

Davids et al.

[11] Patent Number: 4,881,250
[45] Date of Patent: Nov. 14, 1989

[54] COMPACT CHARGE-COUPLED DEVICE HAVING A CONDUCTIVE SHIELDING LAYER

[75] Inventors: Geert J. T. Davids; Wiegert Wiertsema, both of Eindhoven, Netherlands

[73] Assignee: U.S. Philips Corp., New York, N.Y.

[21] Appl. No.: 216,551

[22] Filed: Jul. 7, 1988

[30] Foreign Application Priority Data

Jul. 10, 1987 [GB] United Kingdom ............... 8716237
Jul. 21, 1987 [NL] Netherlands ............... 8701720

[51] Int. Cl.[4] .................... G11C 19/28; G11C 11/34; H01L 29/78
[52] U.S. Cl. ................................ 377/60; 377/61; 357/24; 365/183
[58] Field of Search ............... 357/24; 377/57–63; 365/183

[56] References Cited

U.S. PATENT DOCUMENTS 3,967,254  6/1976  Kosonocky et al. ............ 357/24
4,211,936  7/1980  Kosonocky et al. ............ 357/24
4,376,897  3/1983  Byrne et al. .................. 357/24
4,493,060  1/1985  Varshney ...................... 357/24
4,669,100  5/1987  Slotboom et al. .............. 357/24

Primary Examiner—Gene M. Munson
Attorney, Agent, or Firm—Steven R. Biren

[57] ABSTRACT

A charge-coupled device has a semiconductor body defining a charge transfer channel. Charge storage and charge transfer electrodes are provided for, respectively, defining charge wells within the charge transfer channel and transferring charge between charge wells. Two clock lines provide clock signals to the charge storage and transfer electrodes for controlling movement of charge between charge wells and to an output connection of the charge transfer channel. Signal processing means in the form of a sense amplifier are provided for processing an output from the charge transfer channel and a conductive path connects the output connection and the signal processing means. The conductive path crosses at least one of the clock lines and a conductive shielding layer extends between and is electrically isolated from the said at least one clock line and the conductive path.

11 Claims, 5 Drawing Sheets

COMPACT CHARGE-COUPLED DEVICE HAVING A CONDUCTIVE SHIELDING LAYER

BACKGROUND OF THE INVENTION

This invention relates to a charge-coupled device.

A charge-coupled device is known which comprises a semiconductor body defining a charge transfer channel. Charge storage and charge transfer electrodes are provided for, respectively, defining charge wells within the charge transfer channel and transferring charge between charge wells. Clock signals for controlling movement of charge between charge wells are supplied to the charge storage and charge transfer electrodes by clock lines. A transfer gate is provided to transfer charge packets from the charge transfer channel to an output connection and a conductive path connects the output connection to signal processing means. Such a charge-coupled device is described in, for example, GB-A-2110874 which corresponds to U.S. Pat. No. 4,669,100.

SUMMARY OF THE INVENTION

According to a first aspect of the present invention, there is provided a charge-coupled device, comprising a semiconductor body defining a charge transfer channel, charge storage and charge transfer electrodes for, respectively, defining charge, wells within the charge transfer channel and transferring charge between charge wells, clock lines for providing clock signals to the charge storage and transfer electrodes for controlling movement of charge between charge wells and to an output connection of the charge transfer channel, signal processing means for processing an output from the output connection of the charge transfer channel, and a conductive path connecting the output connection and the signal processing means, characterized in that the conductive path crosses at least one of the clock lines and a conductive shielding layer extends between and is electrically isolated from the said at least one clock line and the conductive path.

A charge-coupled device embodying the present invention thus has a versatile structure enabling closer packing of components since the clock lines which may be supplying clock pulses with very fast rising and falling edges can cross the conductive path which is shielded from the signals on the clock lines by the shielding layer. The shielding layer will be connected to a DC potential, for example ground, in use of the device.

The signal processing means may comprise an amplifier, in particular a sense amplifier, and may comprise a comparator having a first input connected to the conductive path and means for providing a reference signal to a second input of the comparator for comparison with an output of the charge transfer channel. The reference signal providing means may comprise an input connection for supplying a reference charge signal to a reference charge transfer channel, reference charge storage electrodes for defining charge wells in the reference charge transfer channel and reference charge transfer electrodes for transferring charge between charge wells, clock lines providing clock signals to the reference charge storage and to an output connection of the reference charge transfer channel and transfer electrodes to control movement of charge between charge wells of the reference charge transfer channel and a reference conductive path connecting the output connection of the reference charge, transfer channel to the second input of the comparator, a further conductive shielding layer isolated from the reference conductive path being provided to shield the reference conductive path. The provision of the reference shielding layer which will be connected to the same DC potential (for example ground) as the shielding layer enables variations in the potential applied to the shielding layer to be compensated for and generally the area of the reference shielding layer crossing the reference conductive path is equal to the area of the shielding layer crossing the conductive path so as to compensate for capacitive effects. The clock lines for providing the clock signals to the charge storage and charge transfer electrodes of the charge transfer channel may be connected so as also to supply the clock signals to the charge transfer and storage electrodes of the reference charge transfer channel. The reference charge storage and transfer electrodes may be provided, respectively, by extensions of charge storage and transfer electrodes associated with a further charge transfer channel connected in parallel with the charge transfer channel.

The clock line(s) may cross the shielding layer(s) and, in a preferred arrangement, the charge storage electrodes are defined in a first conductive layer level overlying a dielectric layer on a surface of the semiconductor body and the charge transfer electrodes are defined in a second conductive layer level isolated from the charge storage electrodes, the conductive path(s) being defined in the first conductive layer level, the shielding conductive layer(s) in the second conductive layer level and the clock lines being defined in a third conductive layer level on a dielectric layer overlying the charge transfer electrodes. Thus, the shielding layer(s) can be provided without the need for any additional processing steps using part of a conductive layer level which is already required.

The charge transfer channel may comprise a serial output register of a series-parallel-series charge-coupled device.

According to a second aspect of the present invention, there is provided a charge-coupled device structure comprising a plurality of charge-coupled devices in accordance with the first aspect of the invention, a single set of clock lines providing clock signals to the charge transfer and storage electrodes of each charge-coupled device so as to synchronize movement of charge in the charge transfer channels.

A charge-coupled device structure embodying the invention may be particularly compact since the signal processing means can be provided on the side of the clock lines remote from the charge-coupled devices and do not therefore need to be situated between the charge-coupled devices. This means that greater flexibility in the positioning of the signal processing means becomes available enabling the signal processing means to be positioned in the best place to maximize efficient use of area without detrimentally affecting performance. Where several such charge-coupled devices are provided and are in the form of serial-parallel serial (SPS) devices then charge storage and transfer electrodes of the parallel sections of the devices will normally extend right across a row of such devices as will the clock lines of the series input and output registers. By enabling the SPS devices to be placed as close together as possible, the waste length of electrode and clock lines between adjacent SPS devices may be minimized.

BRIEF DESCRIPTION OF THE DRAWING

An embodiment of the invention will now be described, by way of example, with reference to the accompanying drawings, in which.

Figure 1:
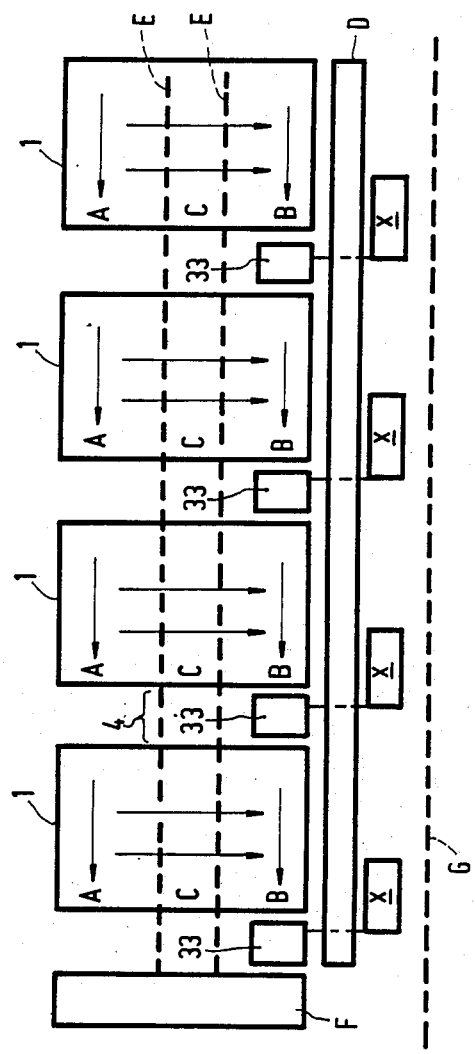
FIG. 1 is a plan view illustrating schematically part of a serial-parallel-serial charge-coupled device structure embodying the invention.

Referring to the drawings, it should first be noted that the Figures are diagrammatic and are not drawn to scale. In particular, certain dimensions, such as thickness, may have been exaggerated while other dimensions may have been reduced in the interests of clarity in the Figures.

DESCRIPTION OF THE PREFERRED EMBODIMENTS

FIG. 1 illustrates very schematically part of a serial-parallel-serial (SPS) charge-coupled device structure embodying the invention, in this example an SPS memory.

As shown in FIG. 1 the structure comprises four SPS memory blocks 1 each of the type to be described in greater detail below with reference to FIG. 2 which shows an SPS structure similar to that described in GB-B-2110874, which corresponds to U.S. Pat. No. 4,669,100. Thus, each memory block 1 comprises an input series register A, an output series register B and a parallel section C between the series registers, which parallel section forms the actual memory matrix. The series registers A and B and parallel section C of each memory block are illustrated only schematically in FIG. 1 by arrows indicating the direction of charge transport.

Figure 2:
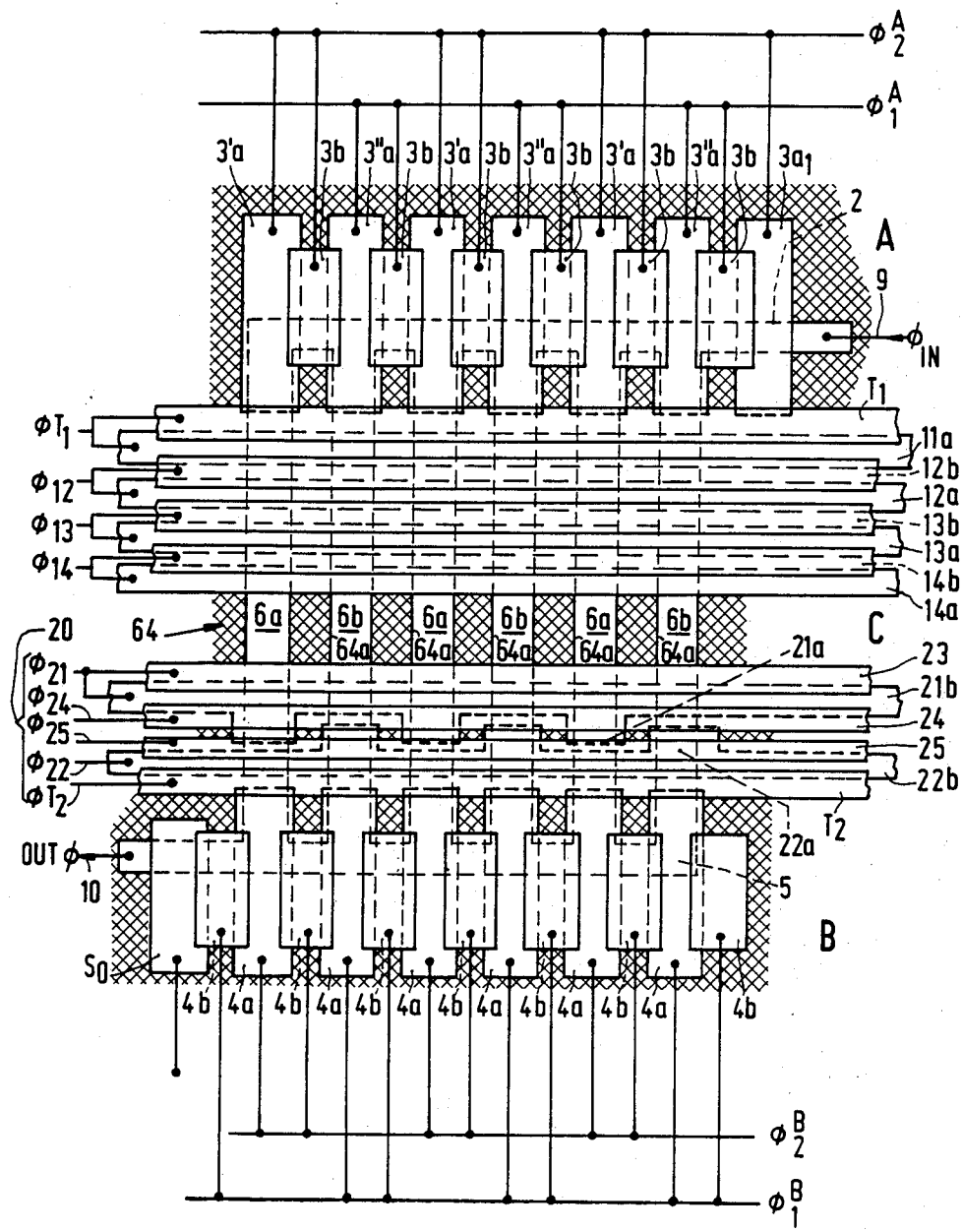
FIG. 2 is a plan view illustrating schematically but in greater detail a serial-parallel-serial memory block of the device structure shown in FIG. 1.

Referring now to FIGS. 1 and 2, the series input register A comprises a charge transfer channel 2 having an input connection 9 (FIG. 2) and alternate charge storage and charge transfer electrodes $3a$ and $3b$. A first one $3a_1$ of the charge storage electrodes enables charge packets introduced via the input connection 9 to enter the series input register A.

The passage of charge packets into the series-input register A of each memory block 1 is controlled by clock signals on clock lines. In the arrangement shown in FIG. 2, a two-phase input series register A is provided and so two clock lines $\phi_1^A$, and $\phi_2^A$ are provided. The series output register B similarly comprises a charge transfer channel 5 having alternate charge storage and charge transfer electrodes $4a$ and $4b$ and again is a two-phase arrangement with two clock lines $\phi_1^B$, and $\phi_2^B$ (illustrated schematically by the block D in FIG. 1) provided for controlling movement of charge packets through the charge transfer channel 5 of the output series register B to an output connection 10 and thence to a signal processing unit X (FIG. 1) as will be described in greater detail hereinafter.

As is known in the art and as is described in GB-B-2110874, in a two-phase system associated charge transfer and storage electrodes are connected to the same controlling clock line (see FIG. 2) and the necessary assymetry to ensure charge transport in the required direction is provided by potential barriers of a known type below the charge transfer electrodes.

As indicated schematically in FIG. 1, the memory blocks 1 share a common set of series input and output register clock lines (only the output register clock lines $\phi_1^B$ and $\phi_2^B$ are shown in FIG. 1 schematically by the block D) so that charge packets can can be moved simultaneously through the input (or output) charge transfer channels 2,5.

The parallel section C of each memory block 1 comprises a number of channels 6 running parallel to one another and transversely (as shown perpendicularly) of the series registers A and B. The channels 6 may be separated merely by channel stopper regions or as described below by field oxide strips $64a$ (indicated by cross-hatching in FIG. 2) with channel stopper regions underneath the field oxide strips. Although only six channels 6 are shown in FIG. 2, it should be appreciated that there will normally be many such channels, for example one hundred of such channels in each memory block 1.

A number, which may be in the order of hundreds, of charge storage electrodes extend transversely across the parallel section C of the memory blocks 1 so that each charge storage electrode defines with each underlying channel 6 a charge storage well so that rows of charge storage wells are provided extending transversely of the channel 6 and spaced apart along the channels 6. Charge transfer electrodes similarly extend across the channels for each transferring charge packets from a row of charge storage wells underlying an associated charge storage electrode to the next charge storage electrode. In the interests of simplicity however FIG. 2 illustrates diagrammatically only charge storage electrodes $11a$, $12a$, $13a$, $14a$ and charge transfer electrodes $12b$, $13b$ and $14b$.

As illustrated schematically in FIG. 1 by the dashed lines E, the charge storage and charge transfer electrodes of the parallel sections C extend right across all four memory blocks and are connected to parallel clock lines $\phi_L$ (where L indicates the particular electrode), that is clock lines $\phi_{12}$, $\phi_{13}$, $\phi_{14}$, etc., indicated schematically by the block F in FIG. 1. The structure shown in FIG. 1 may be symmetrical about an axis G (providing eight memory blocks 1) so that separate clock, charge storage and charge transfer electrodes will be provided on either side of the axis G.

As indicated above the charge storage electrodes $11a$, $12a$, $13a$, $14a$ etc. define with the underlying channels 6 charge storage wells each well providing a memory site of the memory block and the memory sites being arranged as shown in a rectangular matrix structure.

Transfer of charge packets stored in one row of charge wells beneath one charge storage electrode to the next row of the parallel section of each block is controlled by clock signals applied to the clock lines $\phi_L$ of the charge storage and charge transfer electrodes. Although the clock lines $\phi_L$ for supplying signals for controlling the movement of charge packets from row to row through the parallel sections C may provide a two, three or four phase system preferably the parallel section C of each memory block 1 is controlled as a multi-phase or ripple clock, system with every tenth charge transfer electrode and every tenth charge storage electrode of each parallel section C being connected to the same clock line $\phi_L$ (the parallel clock lines being illustrated schematically by the block F in FIG. 1) so that, as described inter alia in U.K. patent specification No. 2105111B which corresponds to U.S. Pat. No. 4,504,930, nine out of ten successive storage sites in each group are filled with information, while the tenth remains empty. By moving the empty place from the bottom to the top the information can be moved from the top to the bottom step by step. The advantage of this mode of operation is the high information density which can be obtained in the parallel section in that only one empty site occurs in every ten sites.

Associated charge transfer and storage electrodes of the parallel section C are controlled by the same clock line and the necessary assymmetry provided by potential barriers under the charge transfer electrodes. In the arrangement shown in FIG. 2, a first or input charge transfer gate $T_1$ and the first charge storage electrode 11a of the parallel section are associated with a clock line $\phi_{T1}$ which does not form part of the ripple clock system but provides a clocking signal for transferring information from the input series register to the parallel section. The following charge storage electrodes 12a, 13a, 14a ... Na and associated charge transfer electrodes 12b, 13b, 14b ... Nb are connected to clock lines $\phi_{12}, \phi_{13} ... \phi_N$ of the ripple clock system. A second or output transfer gate $T_2$ is similarly provided for transferring charge packets from each parallel section C to the associated series output register B.

In the arrangement shown in FIG. 2, a respective channel 6 is associated with each charge storage electrode 3a, 4a of the series input register A and the series output register B of a memory block 1 enabling charge packets to be transferred from under each of the charge storage electrodes 3a of the series input register A to the parallel section C, transported along the associated channel 6 and transferred to the charge well beneath the associated charge storage electrode 4a of the series output register B ready for output from the memory block or charge-coupled device. Such an arrangement enables maximum information density to be obtained. However, because of the two-phase clocking arrangement, it is not possible for the charge storage wells beneath adjacent charge storage electrodes 3a of the series registers A and B to be full at the same time, rather full sites need to alternate with empty sites.

Thus, considering for simplicity a single SPS memory block 1, when information is being input to the series input register A, a first subsidiary row of information is moved as charge packets into the series input register A, under the control of the clock pulses applied to the clock lines $\phi_1^A$ and $\phi_2^A$, so that only charge storage wells beneath alternate charge storage electrodes 3'a are filled. These charge packets are then all transferred at the same time by applying a clock pulse to a clock line $\phi_{T1}$ of the first transfer gate $T_1$, to respective charge storage wells beneath the first charge storage electrode 11a of the parallel section. As charge packets are present only in alternate charge storage wells of the input series register, only the charge storage wells of alternate channels 6a of the first row of charge storage wells beneath the first charge storage electrode 11a are filled. The alternate channels 6a form a first subsidiary group of channels.

With the first subsidiary of the row of information stored in the charge wells of the first subsidiary group of channels 6a, a second subsidiary of the row of information to be stored is moved, as charge packets, into the charge storage wells beneath the remaining charge storage electrodes 3"a under the control of the clock pulses applied to the clock lines $\phi_1^A$ and $\phi_2^A$. When the second subsidiary row of information has been stored under the electrodes 3"a, it is transferred, by applying the appropriate clock signal to the clock line $\phi_{T1}$ of the first transfer gate $T_1$, to the parallel section C from charge wells beneath the electrodes 3"a to the charge storage wells defined by the remaining or second subsidiary group 6b of channels and the overlying first charge storage electrode 11a. The charge packets constituting the two subsidiary rows of information are thus interlaced to define a row of information in the parallel section C and may then be transported in parallel through the parallel section C of the memory block 1.

As mentioned above, the series output register B of each memory block 2 is similar to the series input register A, (being controlled by clock signals on pulses on clock lines $\phi_1^B$ and $\phi_2^B$— FIG. 2) and accordingly only a subsidiary row of information can be read out of the parallel section C of a memory block into the output series register B at one time. It is, of course, normally desirable that information exit the memory block in the order in which it entered the memory block and accordingly the parallel section C of each memory block is provided, as shown schematically in FIG. 2, with an output stage 20 for effecting 'de-interlacing' of the rows of information to enable a first subsidiary row to be transferred out of the memory block via the output series register B followed by the associated second subsidiary row.

As shown in FIG. 2, the output stage 20 comprises first and second toothed and interdigitated charge storage electrodes 21 and 22 arranged so that the teeth 21a of the first charge storage electrode 21 overlie alternate channels 6a forming a first subsidiary group of channels and the teeth 22a of the second charge storage electrode 22 overlie the remaining channels 6b which form a second subsidiary group of channels. A first charge transfer electrode 23 of the output stage 20 serves to transfer charge packets in charge wells of last row of the parallel section to charge wells beneath the charge storage electrode 21 under the control of clock signals on clock line $\phi_{21}$. A second charge transfer electrode 25, under the control of clock signal on clock line $\phi_{25}$, serves to transfer charge in charge wells beneath the teeth 21a of the charge storage electrode 21 to charge wells beneath a spine 22b of the second charge storage electrode 22 so that the first subsidiary row of information is separated from the second subsidiary row of information and can be output to the output series register B first under the control of a clock signal $\phi_{T2}$ applied to the output or second transfer gate $T_2$. Once the first subsidiary row of information has been output from the output series register B, under the control of clock signals $\phi_1^B$ and $\phi_2^B$, the associated second subsidiary row beneath the spine 21b of the charge storage electrode 21 can be transferred by applying an appropriate clock signal to clock line $\phi_{24}$ of a third charge storage electrode 24 to charge wells beneath teeth 22a of the charge storage electrode 22 and thence under control of the clock signal $\phi_{T2}$ to the output series register. Potential barriers under the charge transfer electrodes 23, 24 and 25 again provide the necessary assymetry. The above-mentioned de-interlacing arrangement is described in greater detail in GB-B-2110874.

Figure 3:
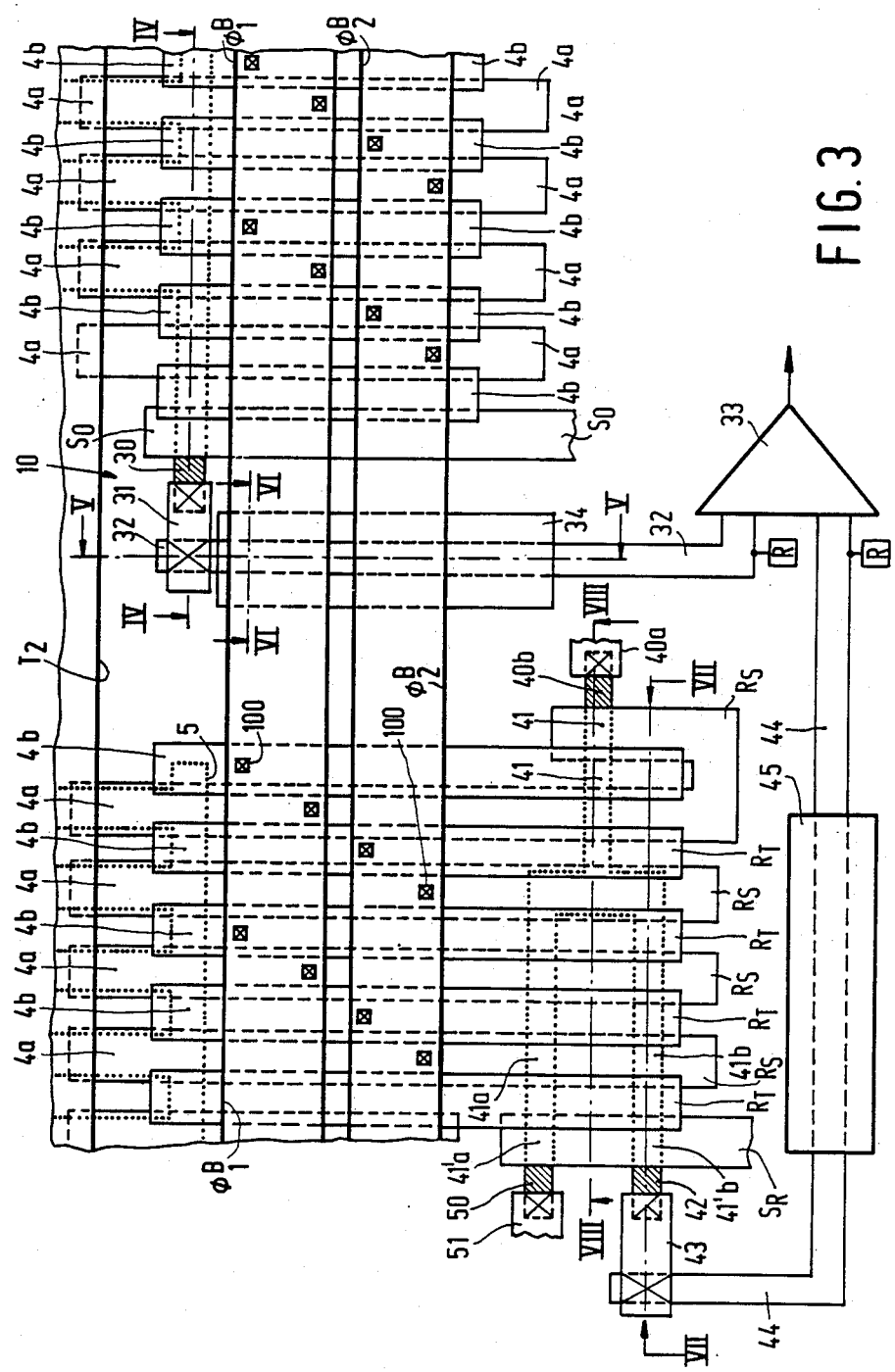
FIG. 3 is an enlarged more detailed schematic plan view of part of the structure shown in FIG. 1.
Figure 4:
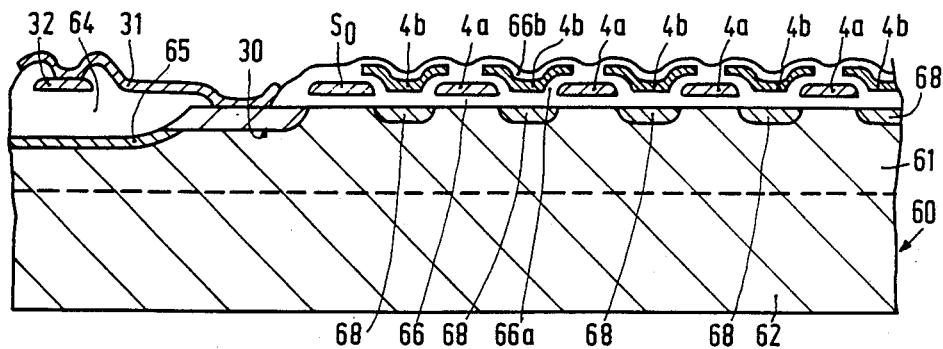
FIG. 4 is a cross-sectional view taken along line IV—IV in FIG. 3.
Figure 5:
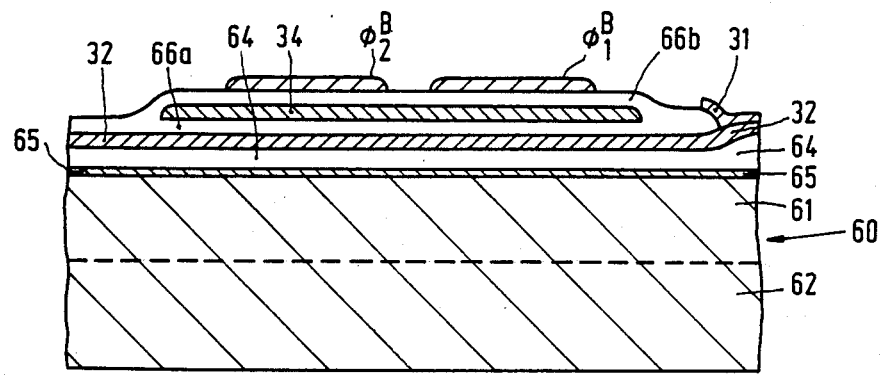
FIG. 5 is a cross-sectional view taken along line V—V in FIG. 3.
Figure 6:
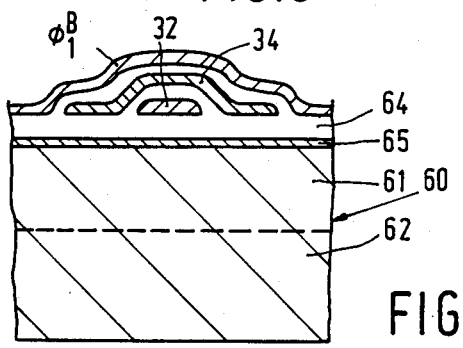
FIG. 6 is a cross-sectional view taken along line VI—VI in FIG. 3.

Referring now to FIGS. 3 to 8 in conjunction with FIGS. 1 and 2, and still considering, for simplicity a single memory block 1, information in the form of charge packets being transferred out of the output series register B is transferred via an output gate electrode So and the associated output connection 10, which comprises an output diode 30, and an interconnection 31 to a conductive path or sense node 32 which supplies the output signal from the output diode 30 to signal processing means X (FIG. 1). The output gate So is maintained at a DC bias voltage to provide electrical isolation and to enable charge packets to pass from the series output register B. In the example being described, the signal processing means comprises means for comparing the output charge signal with a reference charge signal. As shown in FIG. 3, the comparing means comprises a sense amplifier 33 which is illustrated only schematically. The sense amplifier is of conventional design and may be, for example, of a type described in the Chapter entitled Memory Design and Technology of "Large Scale Integration—Devices, Circuits and Systems" published by Wiley (1981) and edited by M. J. Howes and D. V. Morgan or of a type described in "Principles of CMOS VLSI Design" by N. Weste and K. Eshraghian published by Addision Wesley (1985) at pages 364 to 365.

A shielding conductive layer 34 is isolated from and extends over at least part of the conductive path 32. The shielding layer 34 is connected, in use of the structure, to a DC voltage (eg $V_{SS}$). This arrangement enables the clock lines $\phi_1^B$ and $\phi_2^B$, which are isolated from the shielding layer 34, to cross over the sense node or conductive path 32 without increasing or at least without significantly increasing the possibilities of the relatively weak output charge signal on the sense node or conductive path 32 being corrupted, because of capacitive coupling, by the clock signals carried by the clock lines lines $\phi_1^B$ and $\phi_2^B$. This enables as shown in FIGS. 1 and 3, the sense amplifier 33 which requires a relatively large amount of space to be placed on the side of the clock electrodes $\phi_1^B$ and $\phi_2^B$ remote from the memory blocks 1. Thus, as there is no need for the sense amplifiers 33 to be provided to amplify the output charge signal before the output charge signal passes under the clock electrodes $\phi_1^B$ and $\phi_2^B$, the memory blocks 1 can be placed as close together as possible. This may enable the length of the sections 4 (FIG. 1) of the charge storage and transfer electrodes of the parallel sections C extending between adjacent memory blocks 1 to connect them together to be minimized. Similarly, the length of the clock electrodes may be minimized. The normally unusable space between the parallel sections C of the adjacent memory blocks 1 occupied only by the sections 4 of of the charge storage and charge transfer electrodes of the parallel sections C extending between adjacent parallel sections can thus be kept to a minimum.

Figure 7:
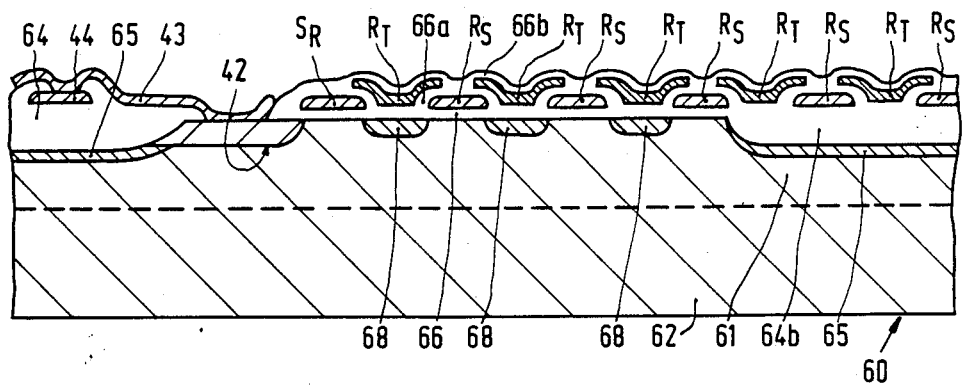
FIG. 7 is a cross-sectional view taken along line VII—VII in FIG. 3.
Figure 8:
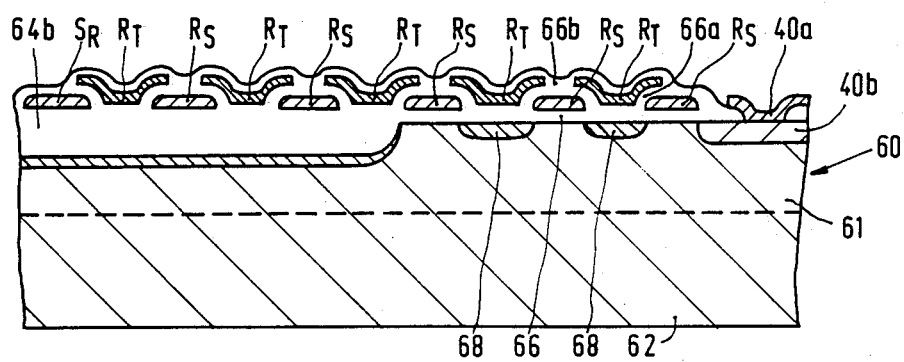
FIG. 8 is a cross-sectional view taken along line VIII—VIII in FIG. 3.

As indicated in FIGS. 3, 7 and 8, the means for providing the reference charge signal for comparison with the output charge take the form of an input conductive track 40a and an input signal of a memory block 1 comprises an input connection 40 in the form of an input conductive track 40a and an input diode 40b for receiving a reference signal from a reference voltage source (not shown) and supplying the reference signal to a bifurcate reference charge transfer channel 41 having two equal width arms 41a and 41b. In the interests of clarity in FIG. 3, the output series register charge transfer channels 5 and the reference charge transfer channel 41 are indicated by dotted lines. Crosses illustrate connections between levels, for example the connection 100 of the clock lines $\phi_1^B$ and $\phi_2^B$ to the underlying electrodes. The free end 41' of one arm 41a of the reference charge transfer channel 41 is connected via an output diode 50 and conductive track 51 to Vdd while the free end 41'b of the other arm 41b of the reference charge transfer channel 41 connects via an output connection in the form of an output diode 42 and an interconnection 43 to a reference conductive path 44 which connects the reference output diode 42 with a second input of the sense amplifier. Reference charge storage and charge transfer electrodes $R_S$ and $R_T$ are associated with the bifurcate charge transfer channel 41 to, respectively, define charge wells in the bifurcate charge transfer channel 41 and to transfer charge packets between charge wells. Again, potential barriers under the charge transfer electrodes provide the necessary assymetry. Clock electrodes are provided for supplying clock signals to the reference charge storage and charge transfer electrodes $R_S$ and $R_T$. As shown in FIG. 3, the reference charge storage and charge transfer electrodes $R_S$ and $R_T$ are provided by extensions of the charge storage and charge transfer electrodes 4a, 4b at the beginning of the output series register B of the adjacent memory block 1 remote from the output connection 10 (FIG. 2) of that block. Accordingly, movement of charge packets through the bifurcate charge transfer channel 41 occurs in synchronism with movement of charge packets through the output series registers B.

A reference gate electrode $S_R$ maintained at a DC bias voltage to provide an electrical isolation barrier against cross-talk enables the charge packet to pass from the arm 41b of the reference charge transfer channel to the reference output diode 42. Although not shown, the reference gate electrode $S_R$ is integral with the output gate electrode So, both of which are maintained at the DC voltage.

The reference charge input signal which is derived from the voltage source signal to the input diode of the SPS memory block is arranged to be equivalent to a charge packet of the output charge signal of the memory block 1 and is divided in half by the bifurcate charge transfer channel 41 so that a reference charge packet equivalent to approximately half an output charge packet is supplied to the second input of the sense amplifier 33.

The reference conductive path 44 is arranged to be of the same dimensions as the conductive path 32 so that both paths offer the same or as close as possible capacitance to an output charge signal. A reference conductive shielding layer 45 is provided over and isolated from the reference conductive path 44. Like the shielding layer 34, the reference shielding layer 45 is connected to a DC potential (eg $V_{SS}$). The reference shielding layer 45 is arranged so that the area of the part of the reference shielding layer 45 overlying the reference conductive path 44 is equal to the area of the part of the shielding layer 34 overlying the conductive path 32 so that any capacitive effects resulting from a variation in the DC potential (which may be ground) applied to the shielding layer 34 are similarly applied to the reference shielding layer 44 so that the output charge signal and the reference charge signal are subject to the same fluctuations. As the sense amplifier 33 takes the difference between the output charge signal and the reference charge signal, such fluctuations are compensated for and the sense amplifier provides an output signal representative of the signal originally input to the memory block. The signal processing means may comprise further procesing steps and may supply a processed signal back to the input series register A of the same memory block 1 or supply the signal to an output of the memory or to another memory block 1 depending upon control signals applied thereto. The necessary reset gates for the reference charge transfer channel 41 and the series output register B are provided by conventional MOS structures which are illustrated schematically by blocks R in FIG. 3. The reset gates may be provided between the sense amplifier 33 and shielding layers 45 and 32 as shown or before the shielding layers.

The structure of a memory block 1 will now be described in greater detail with reference to FIGS. 1 to 8.

As shown most clearly in FIGS. 4 to 8, the device comprises a semiconductor body 60 in this example a p-type semiconductor body of monocrystalline silicon. The semiconductor body 60 comprises at least a surface layer 61 having a comparatively low doping concentration of between $10^{15}$ and $10^{16}$ acceptor atoms per cm. This layer may cover the whole thickness of the semiconductor body but in another important embodiment it may also be provided as a comparatively high-ohmic layer having a thickness between 5 and 10 $\mu$m on a low-ohmic p-type substrate 62 having a doping concentration between $10^{19}$ and $10^{20}$ atoms per cm$^3$. As is known, this construction of the semiconductor body has the advantage that the leakage currents can be restricted. In FIGS. 4 to 8 this possible composition is indicated by the broken lines separating the epitaxial layer 61 from the substrate 62.

The channels 6a and 6b of the parallel sections C, the channels 2 and 5 of the series input and series output registers A and B of each SPS memory block 1 and the reference charge transfer channel 41 are defined in the p-type layer 61. For this purpose, the surface of the semiconductor body has a field oxide pattern 64 (shown schematically by cross-hatching in FIG. 2) which covers a large part of the surface and has openings at the area of the channels 6a, 6b and 41 and the channels 2 and 5 of the series registers A and B, strips 64a of the field oxide pattern separating adjacent channels 6a and 6b and strips 64b separating the arms 41a and 41b of the bifurcate reference charge transfer channel 41. Of course, the field oxide pattern 64 may also have openings outside the part shown in the Figures in places where peripheral circuits are provided. The field oxide pattern 64, the thickness of which may be between 0.4 $\mu$m and 0.7 $\mu$m is formed in the present embodiment by means of local oxidation of the silicon body. In order to prevent parasitic channel formation, the doping concentration below the oxide pattern 64 is increased by providing p-type channel stopper zones or regions 65.

The width of the channels 6a, 6b and 41 is, for example, approximately 2 $\mu$m, while the width of the field oxide strips 64a which separate the channels 6a and 6b is, for example, approximately 2 $\mu$m.

At the area of the channels 2, 6a, 6b, 5 and 41 the surface of the semiconductor body is covered with a thin dielectric layer, for example a silicon oxide layer 66 with a thickness of, for example, between approximately 0.05 and 0.013 $\mu$m.

The charge storage electrodes 3a, 4a, 11a ... Na, 21 and 22, the conductive paths 32 and 44, series output register output gate $S_O$ and reference output gate $S_R$ are provided in this embodiment by depositing and patterning a first doped polycrystalline silicon layer on the dielectric layers 64 and 66. A further thin layer of dielectric material, again for example a silicon oxide layer, 66a, covers these charge storage electrodes 3a, 4a, 11a ... Na, 21, 22, So, $S_R$ and conductive paths 32 and 44 defined by the first polycrystalline silicon layer and a second doped polycrystalline silicon layer is deposited and patterned to provide the charge transfer electrodes 3b, 12b etc., 24, 25, 26, 4b, the transfer gate $T_1$ and $T_2$, and shielding layers 34 and 45. Thus, the shielding layers 34 and 35 can be provided without the need for any additional processing steps. The thickness of the dielectric layer 66a under the charge transfer electrodes and transfer gates may be approximately 0.13 $\mu$m. As illustrated the charge transfer electrodes of course overlap slightly the underlying charge storage electrodes and the teeth of the charge storage electrodes 21 and 22 forming the output stage 20 of the parallel section C similarly overlap onto the field oxide strips 64a so as to cover the entire width of the channels. P-type implantations 68 (shown in FIGS. 4 to 8) are provided beneath the charge transfer electrodes 3b, 12b ... Nb, 24, 25, 26, 4b to provide the necessary assymetry.

Further dielectric material, for example a further layer 66b of silicon dioxide, is provided over the second polycrystalline silicon layer and conductive material, for example a metal such as aluminum, deposited to provide the series clock lines $\phi_1^A$ and $\phi_2^A$, $\phi_1^B$ and $\phi_2^B$, the clock lines $\phi_L$ for the parallel section, interconnections 31 and 43 and conductive tracks (not shown) for the necessary connections.

Part of the final conductive layer may provide first and second conductive tracks (not shown) extending over the input and output transfer gates $T_1$ and $T_2$ and contacted thereto outside the area of the memory blocks. These conductive tracks are provided to reduce delay which may otherwise occur because of the relatively high resistance (compared to aluminum) of the doped polycrystalline silicon electrodes. The conductive tracks will be connected to the underlying transfer gates $T_1$ and $T_2$, once between each block, enabling further reduction of possible delay time.

The operation of an SPS memory block 1 of the charge-coupled device structure 1 shown in FIGS. 1 will now be briefly described. It should be understood that similar events will be occurring simultaneously in all SPS memory blocks 1.

As mentioned above, the number of elements (an element being considered as a charge storage electrode 3a or 4a and its associated charge transfer electrode 3b or 4b) in the series registers A and B is not important and may be any desired number, there being for practical reasons an upper limit of, for example, 420 elements. Where an SPS memory block 1 forms, for example, one of thirty-two parallel memory blocks of a video memory, then each row of the parallel section may be capable of storing 90 bits. The number of rows of information which a memory block can store will be determined by the number of elements (each element consisting of a charge storage electrode and its associated charge transfer electrode) of the parallel section of the

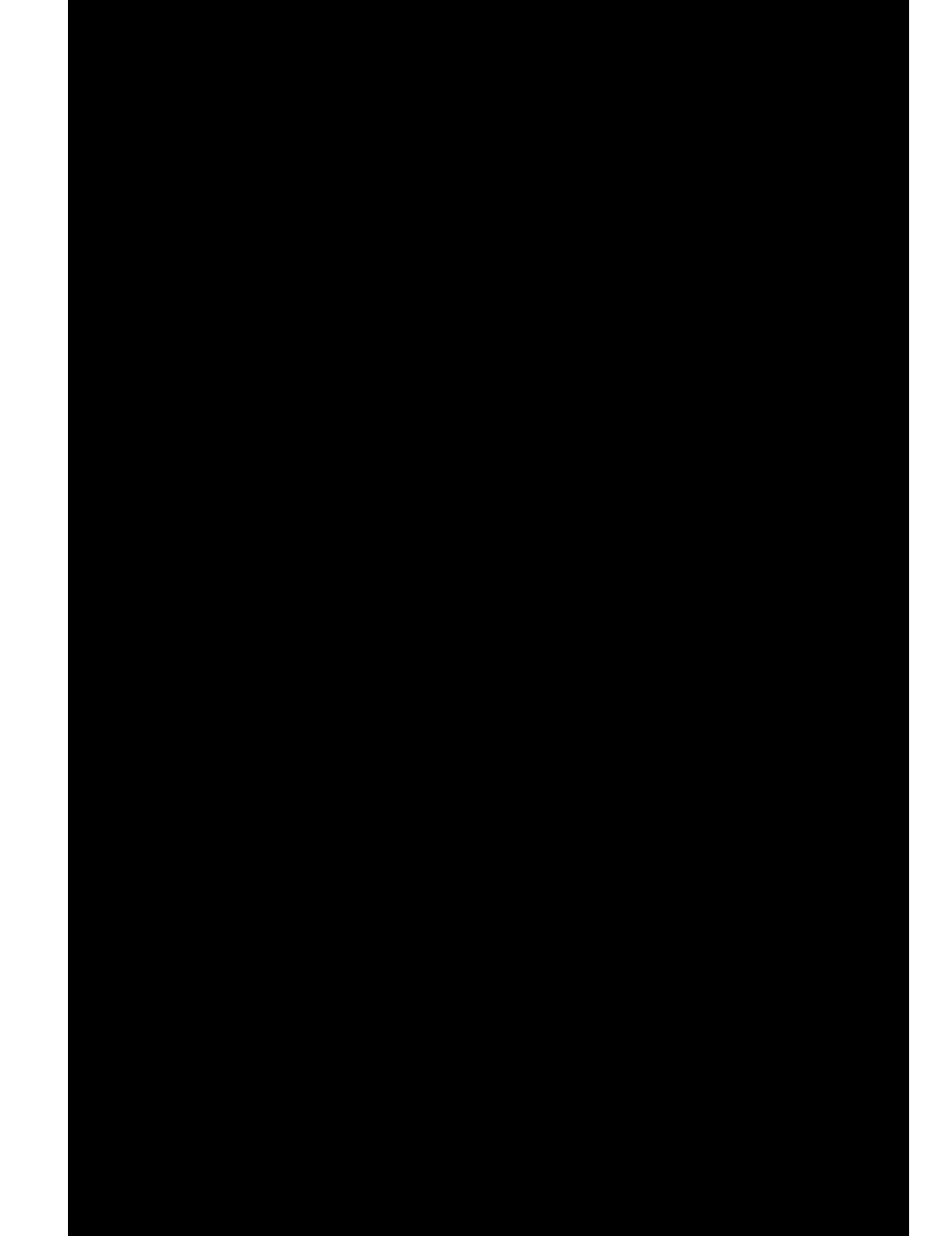

the voltages of the clock signals would be required. Similarly, the invention may be applicable where the semiconductor body is formed of a semiconductor material other than silicon, with appropriate consideration being given to the different properties of the semiconductor body and where the charge storage and charge transfer electrodes are formed of a conductive material or a composite of layers of different conductive material other than doped polycrystalline silicon.

From reading the present disclosure, other modifications will be apparent to persons skilled in the art. Such modifications may involve other features which are already known in the design of charge-coupled devices and which may be used instead of or in addition to features already described herein. Although claims have been formulated in the application to particular combinations of features, it should be understood that the scope of the disclosure of the present application also includes any novel feature or any novel combination of features disclosed herein either explicity or implicitly or any generalization or modification of one or more of those features which would be obvious to persons skilled in the art, whether or not it relates to the same invention as presently claimed in any claim and whether or not it mitigates any or all of the same technical problems as does the present invention.

We claim:

1. A charge-coupled device, comprising a semiconductor body defining a charge transfer channel, charge storage and charge transfer electrodes for, respectively, defining charge wells within the charge transfer channel and transferring charge between charge wells, clock lines for providing clock signals to the charge storage and transfer electrodes for controlling movement of charge between charge wells and to an output connection of the charge transfer channel, signal processing means for processing an output from the output connection of the charge transfer channel, and a conductive path connecting the output connection and the signal processing means, characterized in that the conductive path crosses at least one of the clock lines and a conductive shielding layer extends between and is electrically isolated from said at least one clock line and the conductive path.

2. A charge-coupled device according to claim 1, wherein the signal processing means comprises an amplifier.

3. A charge-coupled device according to claim 1 or 2, wherein the signal processing means comprises a comparator having a first input connected to the conductive path and means for providing a reference signal to a second input of the comparator for comparison with the output of the charge-coupled device.

4. A charge-coupled device according to claim 3, wherein the reference signal providing means comprises an input connection for supplying a reference charge signal to a reference charge transfer channel, reference charge storage electrodes for defining charge wells in the reference charge transfer channel and reference charge transfer electrodes for transfering charge between charge wells, the clock lines providing clock signals to the reference charge storage and transfer electrodes to control movement of charge between charge wells of the reference charge transfer channel and to an output connection of the reference charge transfer channel, and a reference conductive path connecting the output connection of the reference charge transfer channel to the second input of the comparator, a further shielding layer isolated from the reference conductive path being provided to shield the reference conductive path.

5. A charge-coupled device according to claim 4, wherein the clock lines for providing the clock signals to the charge storage and transfer electrodes of the charge transfer channel are connected so as also to supply the clock signals to the charge transfer and storage electrodes of the reference charge transfer channel.

6. A charge-coupled device according to claim 5, wherein the reference charge storage and charge transfer electrodes are provided, respectively, by extensions of charge storage and transfer electrodes associated with a further charge transfer channel connected in parallel with the charge transfer channel.

7. A charge-coupled device according to claim 4, wherein the area of the reference shielding layer crossing the reference conductive path is equal to the area of the shielding layer crossing the conductive path.

8. A charge-coupled device according to claim 1 or 2, wherein the clock line(s) cross the shielding layer.

9. A charge-coupled device according to claim 1 or 2, wherein the charge storage electrodes are defined in a first conductive layer level overlying a dielectric layer on a surface of the semiconductor body and the charge transfer electrodes are defined in a second conductive layer level isolated from the charge storage electrodes, the conductive path(s) being defined in the first conductive layer level, the shielding conductive layer(s) in the second conductive layer level and the clock lines being defined in a third conductive layer on a dielectric layer overlying the charge transfer electrodes.

10. A charged coupled device according to claim 1 or 2, wherein the charge transfer channel comprises a serial output register of a series-parallel-series charge-coupled device.

11. A charge-coupled device structure comprising a plurality of charge-coupled devices in accordance with claim 1 or 2, a single set of clock lines providing clock signals to the charge transfer and storage electrodes so as to synchronize movement of charge in the charge transfer channels.

* * * * *